United States Patent
Ma

(10) Patent No.: US 6,979,897 B2
(45) Date of Patent: Dec. 27, 2005

(54) PACKAGE SUBSTRATE FOR IMPROVING ELECTRICAL PERFORMANCE

(75) Inventor: Shu-Jung Ma, Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 10/820,765

(22) Filed: Apr. 9, 2004

(65) Prior Publication Data
US 2004/0207067 A1    Oct. 21, 2004

(30) Foreign Application Priority Data
Apr. 17, 2003 (TW) .............................. 922206235 U

(51) Int. Cl.[7] .......................... H01L 23/52; H01L 23/48; H01L 23/052; H01L 23/12; H01L 29/40
(52) U.S. Cl. ...................... 257/691; 257/700; 257/774; 257/784; 257/692; 257/786
(58) Field of Search ................... 257/774, 784, 257/786, 691, 692, 698, 700

(56) References Cited

U.S. PATENT DOCUMENTS 6,064,113 A * 5/2000 Kirkman ..................... 257/691
6,440,770 B1 * 8/2002 Banerjee et al. ............. 438/106
6,630,743 B2 * 10/2003 Magnuson et al. .......... 257/774

FOREIGN PATENT DOCUMENTS

| TW | 490818 | 6/2002 |
|---|---|---|
| TW | 434664 | 7/2003 |

* cited by examiner

Primary Examiner—Steven Loke
Assistant Examiner—Samuel A. Gebremariam
(74) Attorney, Agent, or Firm—Troxell Law Office, PLLC

(57) ABSTRACT

A package substrate for improving electrical performance includes at least an insulating layer, a wiring layer and a ground/power layer. The wiring layer is formed on a top surface of the insulating layer, and includes a plurality of inner fingers, a plurality of outer fingers and a metal ring. A plurality of inner through holes are formed through the insulating layer to electrically connect corresponding inner fingers to bottom surface of the insulating layer. The ground/power layer has a plurality of openings formed on a bottom surface of the insulating layer. The plurality of inner through holes are crowded in groups to pass through the openings which are electrically isolated from the ground/power layer. Each group of the inner through holes are arranged in grid array or radial arrangement so that a distance between two adjacent openings not less than 0.2 mm for improving electrical performance of the ground/power layer.

9 Claims, 4 Drawing Sheets

PACKAGE SUBSTRATE FOR IMPROVING ELECTRICAL PERFORMANCE

FIELD OF THE INVENTION

The present invention relates to a package substrate for semiconductor packages, and more particularly to a package substrate with ground/power layers for improving electrical performance.

BACKGROUND OF THE INVENTION

Conventionally, package substrates are used as chip carriers and electrical interconnections for semiconductor packages. Wiring layouts in the substrates are to serve as electrical connections with signal electrodes, ground and power electrodes of chips. R.O.C. Patent No. 490818 entitled "substrate for semiconductor chip package" discloses a package substrate having a chip-attaching region. A ground ring and a power ring are formed on top surface of the substrate. A plurality of first contact pads and second contact pads are formed on bottom surface of the substrate for bonding solder balls. The first contact pads are located below the perimeter of ground ring and the power ring, and are divided into two groups. The first group of the first contact pads is electrically connected with the ground ring for connecting ground electrodes of the chip. The second group of the first contact pads is electrically connected with the power ring for connecting power electrodes of the chip. The second contact pads are arranged around the first contact pads so as to electrically connect signal electrodes of the chip.

In order to improve the electrical performance of a semiconductor package, the substrate includes at least one ground/power layer between the contact pads and the ground/power ring. A substrate using a multi-layer PWB is disclosed in R.O.C. Patent No. 434664 entitled "lead-bond type chip package and manufacturing method thereof". The substrate includes an interlayer circuit board having pre-preg disposed thereon. The interlayer circuit board possesses a metal ground/power plane so as to connect the ground/power source. Nevertheless, when a plurality of through holes are massively formed on multi-layer substrate for electrically connecting with lead fingers (signal), the through holes can not electrically be connected with the ground/power plane by forming a plurality of openings in the ground/power plane. Therefore, each opening is round corresponding to each through hole in position, enables the through holes to electrically insulate against the ground/power plane. However, electrical performance of the package substrate will be imparied when the through holes in the ground/power plane are mass and in irregular distribution.

SUMMARY

The primary object of the present invention is to provide a package substrate for improving electrical performance. A plurality of openings are formed in the ground/power layer in a manner that the inner through holes electrically connected with inner fingers are divided into a plurality of groups to pass through corresponding openings in the format of grid array. The ground/power layer has a strip-shaped region between adjacent openings to improve electrical performance of a metal ring and the ground/power layers.

According to the present invention, the package substrate includes a first insulating layer, a wiring layer and at least a ground/power layer. The first insulating layer has a top surface and a bottom surface, and the top surface includes a chip-attaching region. A wiring layer is formed on the top surface of the first insulating layer, which includes a plurality of inner fingers and a plurality of outer fingers for electrically connecting with a chip. A plurality of inner through holes and a plurality of outer through holes are formed through the first insulating layer to electrically connect corresponding inner fingers and outer fingers respectively. The ground/power layer is disposed on the bottom surface of the first insulating layer and has a plurality of openings. Each opening permits the inner through holes being divided into a plurality of groups to pass through the ground/power layer with electrical isolation. Each group of inner through holes passes through corresponding opening in grid array or radial arrangement. Thus the ground/power layer between two adjacent openings has a strip-shaped region. Preferably, a distance between two adjacent openings is not less than 0.2 mm for improving electrical performance.

DEATAIED DESCRIPTION OF THE PRESENT INVENTION

Referring to the attached drawings, the present invention will be described by means of the embodiments below.

Figure 1:
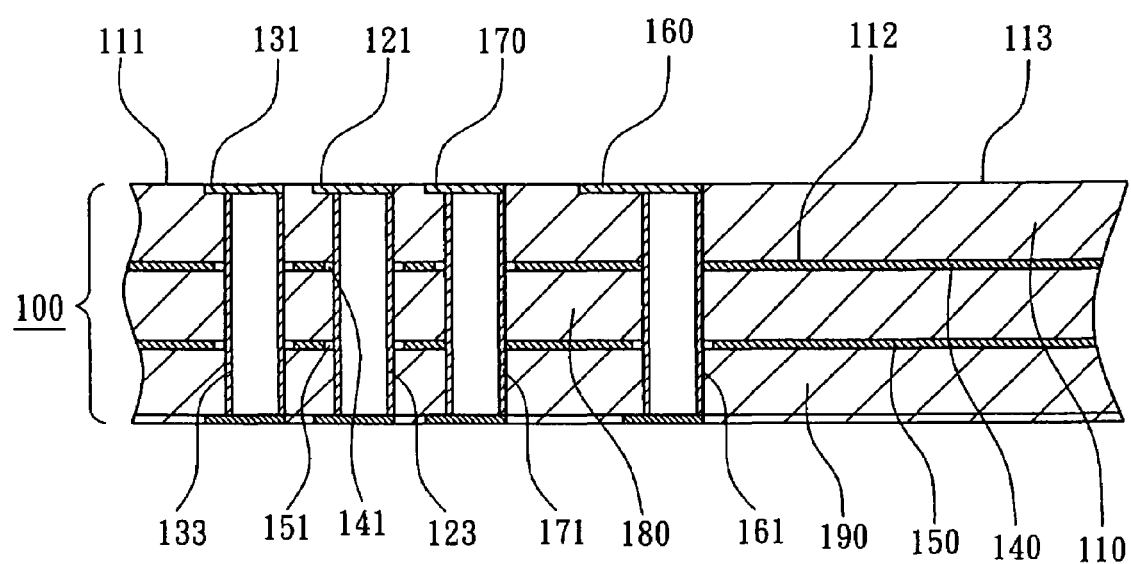
FIG. 1 is a cross-sectional view illustrating a package substrate for improving electrical performance of an embodiment of the present invention.
Figure 2:
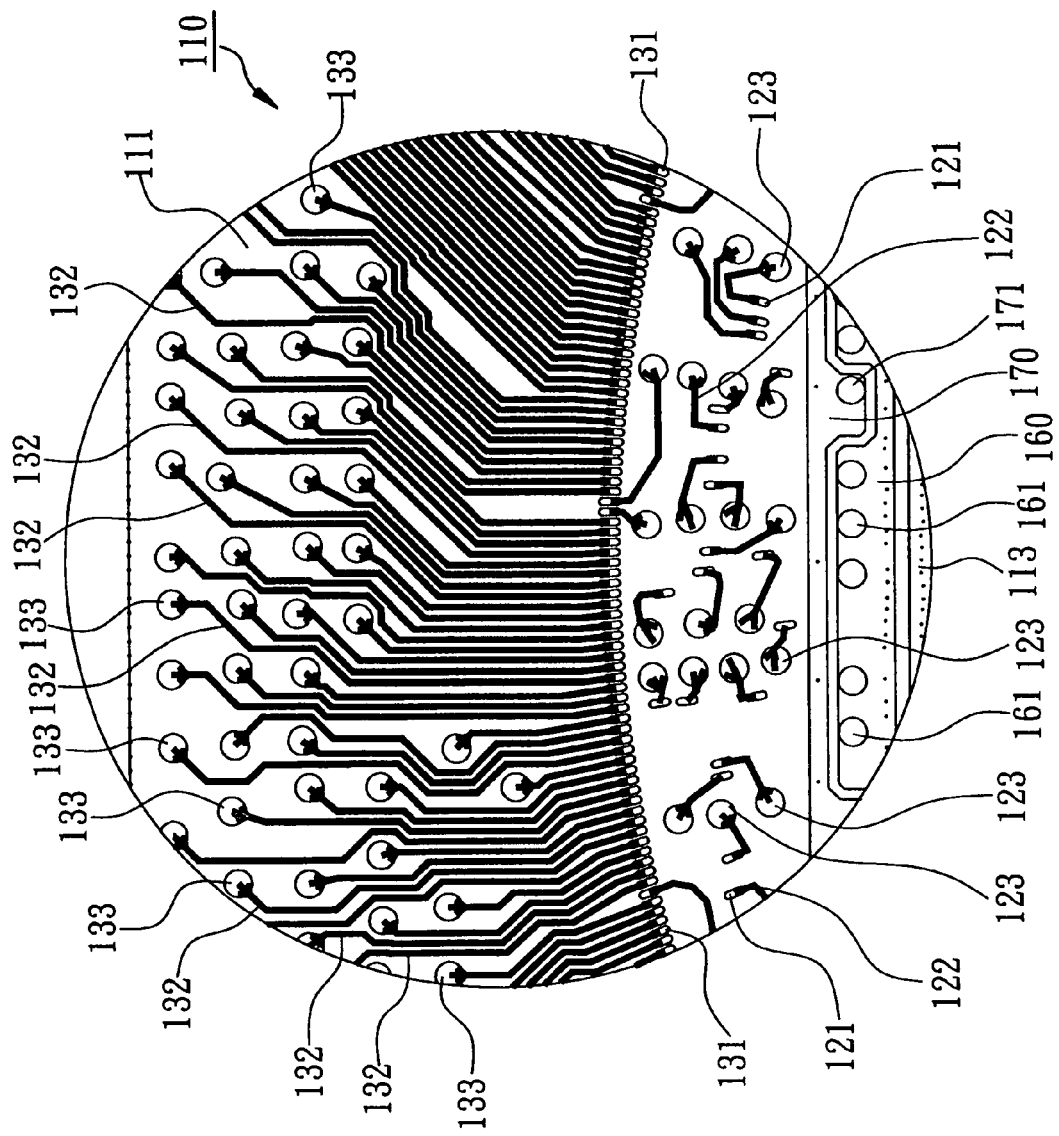
FIG. 2 is a top view illustrating the first insulating layer of package substrate for improving electrical performance of the embodiment of the present invention.

As shown in FIG. 1, according to the present invention a package substrate 100 for improving electrical performance mainly comprises a first insulating layer 110, a wiring layer and at least a ground/power layer (which includes a ground layer 140 and a power layer 150). The first insulating layer 110 is made of glass fiber reinforced resin of FR-4, FR-5, BT resin, or a soft insulating layer, such as polyimide. The first insulating layer 110 has a top surface 111 and a bottom surface 112. The top surface 111 includes a chip-attaching region 113 for attaching a semiconductor chip 200 (referring to FIGS. 1 and 4). The wiring layer is formed on top surface 111 of the first insulating layer 110. As shown in FIG. 1 and FIG. 2, the wiring layer includes a plurality of inner fingers 121, a plurality of outer fingers 131 and a plurality of traces 122, 132. The inner fingers 121 and the outer fingers 131 are distinguished according to the distances from the chip-attaching region 113. The inner fingers 121 are closer to the chip-attaching region 113 than the outer fingers 131. Both the inner fingers 121 and outer fingers 131 are used to electrically connect the signals of a semiconductor chip 200. Also, a plurality of inner through holes 123 are electrically connected with the inner fingers 121 by corresponding traces 122. A plurality of outer through holes 133 are electrically connected with the outerfingers 131 by corresponding traces 132. The inner through holes 123 and the outer through holes 133 are formed through the first insulating layer 110 to electrically connect the top surface 111 and the bottom surface 112. In this embodiment, the wiring layer further includes a ground metal ring 160 and a power metal ring 170 around the chip-attaching region 113. The inner fingers 121 are disposed between the metal ring 160, 170 and the outer fingers 131.

Figure 3:
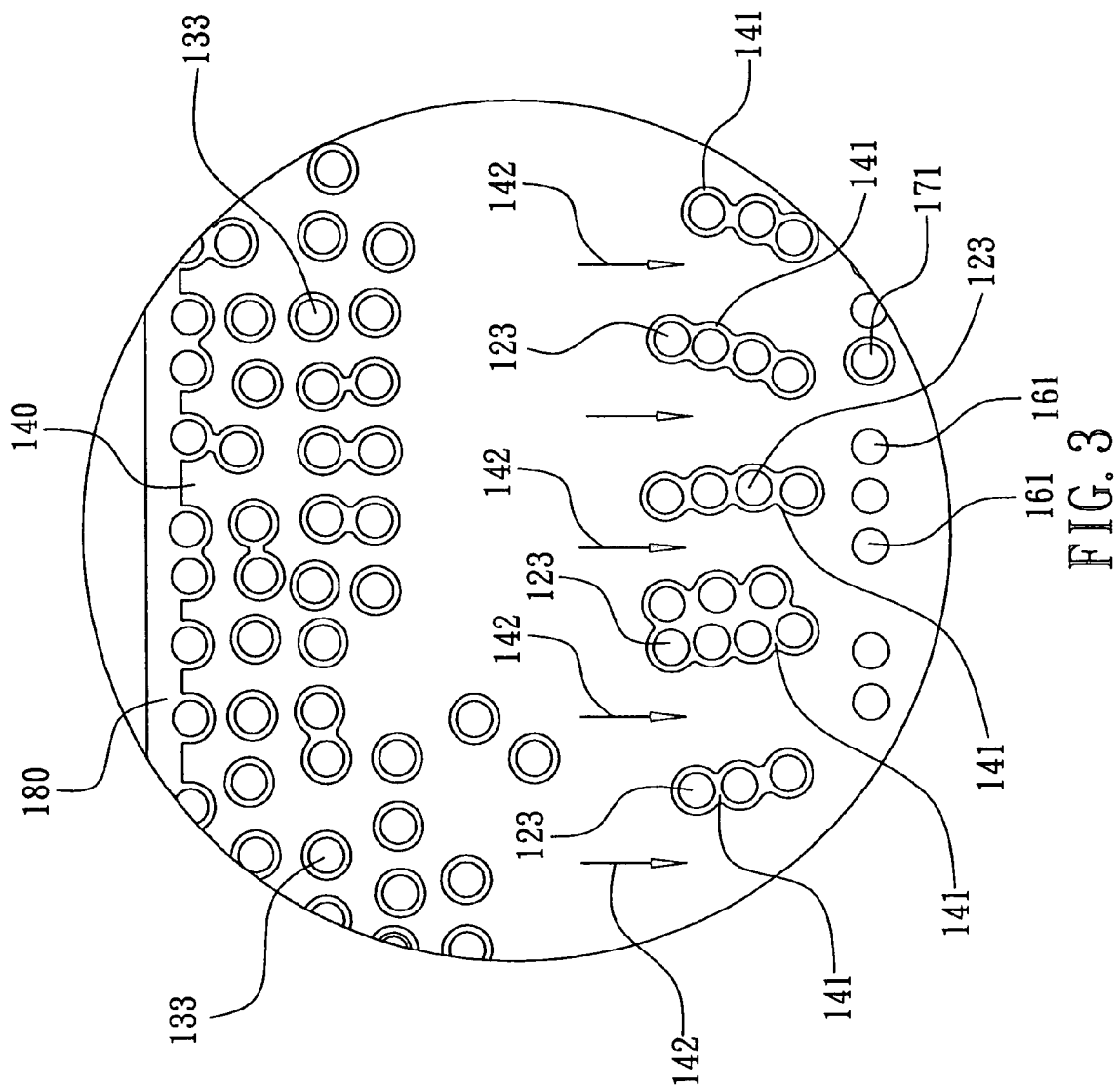
FIG. 3 is a cross-sectional view illustrating a ground/power layer formed on the package substrate for improving electrical performance of the embodiment of the present invention.

In this embodiment as shown in FIG. 1 and FIG. 3, the ground layer 140 is formed on the bottom surface 112 of the first insulating layer 110 as a ground for the chip 200, which may be a copper foil or other metal foil. The package substrate 100 can further includes a second insulating layer 180 disposed on the bottom surface 112 of the first insulating layer 110 to sandwich the ground layer 140 between the first insulating layer 110 and the second insulating layer 180. At least a ground through hole 161 is formed through the first insulating layer 110 so as to connect the ground metal ring 160 and the ground layer 140 at different planes. The ground layer 140 has a plurality of openings 141. The openings 141 are arranged radially to the chip-attaching region 113 in a shape of strip or circle, wherein the openings 141 in a strip-shaped are formed for passing through a mass of inner through holes 123 crowded in groups. Thus the inner through holes 123 are divided into a plurality of groups. Each group of the inner through holes 123 arranges in single-line or multi-line grid array and is formed through each corresponding opening 141, but electrical isolated from the ground layer 140. Therefore the ground layer 140 has a strip-shaped region between two adjacent openings 141. The strip-shaped region of the ground layer 140 between two adjacent openings 141 is not less than 0.2 mm in width to provide a satisfied current path 142.

Besides, a power layer 150 may be formed on bottom surface of the second insulating layer 180, and at least a power through hole 171 is formed in the package substrate 100. The power through hole 171 passes through the first insulating layer 110 and the second insulating layer 180, and electrically connect the power metal ring 170 and the power layer 150. The power layer 150 has a plurality of openings 151. Each group of the inner through holes 123 are corresponding to each opening 151 so as to pass through the opening 151 in groups with electrical isolation from the power layer 150. Each group of the inner through holes 123 is located in each corresponding opening 151 in the format of grid array. The openings 151 of the power layer 150 are similar to the openings 141 of the ground layer 140 mentioned above. The power layer. 150 has a strip-shaped region (not showed in the drawings) between two adjacent openings 151 so as to improve electrical performance.

Figure 4:
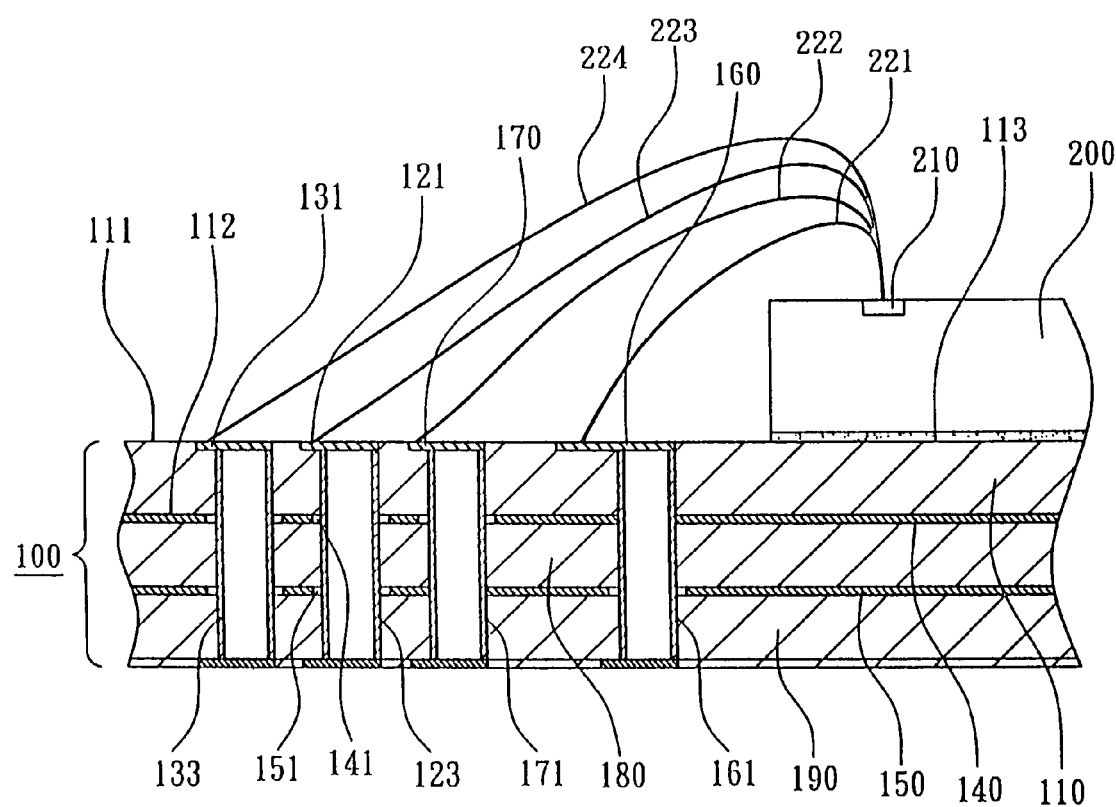
FIG. 4 is a partial cross-sectional view illustrating the package substrate for improving electrical performance used in a semiconductor package.

Referring to FIG. 4, when the package substrate 100 mentioned-above is used for a semiconductor package, a semiconductor chip 200, such as a microprocessor, microcontroller or chip with high-density terminals, is attached to the chip-attaching region 113 of the package substrate 100. The chip 200 has a plurality of bonding pads 210 on active surface thereof. The bonding pads 210 are divided into ground bonding pads, power bonding pads and signal bonding pads. The ground bonding pads among the bonding pads 210 of the chip 200 are electrically connected with the ground metal ring 160 by bonding wires 221. The power bonding pads among the bonding pads 210 of the chip 200 are electrically connected with the power metal ring 170 by bonding wires 222, some of the signal bonding pads among the bonding pads 210 of the chip 200 are electrically connected with the inner fingers 121 by bonding wires 223, and the rest of signal bonding pads among the bonding pads 210 of the chip 200 are electrically connected with the outer fingers 131 by bonding wires 224. The inner through holes 123 pass through the openings 141 of the ground layer 140 and the openings 151 of the power layer 150 in groups, moreover, the openings 141,151 are densely designed to ensure the ground layer 140 and the power layer 150 have the strip-shaped region for improving electrical performance of the semiconductor package.

Besides, the present invention doesn't limit quantity of the insulating layer and the wiring layer, a third insulating layer 190 or more insulating layer and more wiring layer can be formed on bottom surface of the second insulating layer 180. A plurality of ball pads for placing solder balls (not showed in the drawings) can be formed on the lowest layer of insulating layer of the package substrate 100 and are electrically connected to corresponding inner fingers 121, outer fingers 131, ground metal ring 160 and power metal ring 170.

Moreover, the present invention doesn't limit relative location of the ground layer 140 and the power layer 150, the power layer 150 can be formed on the bottom surface 112 of the first insulating layer 110 or bottom surface of other insulating layers. Besides, the inner through holes 123 also can easily formed in the package substrate 100 without influencing the width of the ground/power layer 140 or 150 between the adjacent openings 141 or 151. Each opening 141 or 151 allows at least one through hole 123 to pass through, but openings 141 or 151 can be regularly arranged to close to each other when there are many openings, such as in grid array or in radial arrangement, so that the ground/power layer 140 or 150 still has a current path 142 which is more than 0.2 mm in width.

The above description of embodiments of this invention is intended to illustrate but is not limited. Other embodiments of this invention will be obvious to those skilled in the art in view of the above disclosure.

What is claimed is:

1. A package substrate for improving electrical performance comprising:
    a first insulating layer having a top surface and a bottom surface;
    a plurality of groups of inner fingers formed on the top surface of the first insulating layer for electrically connecting to a chip;
    a plurality of outer fingers formed on the top surface of the first insulating layer for electrically connecting to the chip;
    a plurality of outer through holes formed through the first insulating layer and electrically connected to the corresponding outer fingers;
    a plurality of inner through holes formed through the first insulating layer and electrically connected to the corresponding inner fingers; and
    a ground/power layer located on the bottom surface of the first insulating layer, and having a plurality of openings, wherein a group of the inner through holes including at least two of the inner through holes passes through and is corresponding to one of the plurality of openings to be electrically isolated from the ground/power layer.

2. The substrate in accordance with claim 1, wherein a distance between two adjacent openings of the plurality of openings is not less than 0.2 mm.

3. The substrate in accordance with claim 1, wherein the ground/power layer between two adjacent openings of the plurality of openings is in strip shape.

4. The substrate in accordance with claim 1, wherein a plurality of groups of the inner through holes pass through the corresponding openings and are arranged in a radial arrangement.

5. The substrate in accordance with claim 1, wherein the top surface of the first insulating layer includes a chip-attaching region.

6. The substrate in accordance with claim 5, wherein the plurality of openings are radially oriented to the chip-attaching region.

7. The substrate in accordance with claim 5, further comprising a metal ring formed on the top surface of the first insulating layer between the chip-attaching region and the inner fingers.

8. The substrate in accordance with claim 1, further comprising a second insulating layer formed below the bottom surface of the first insulating layer and the ground/power layer located between the first insulating layer and the second insulating layer.

9. The substrate in accordance with claim 8, further comprising another ground/power layer on the a bottom surface of the second insulating layer.

* * * * *